United States Patent
Schiltmans et al.

[11] Patent Number: 5,942,960
[45] Date of Patent: Aug. 24, 1999

[54] PRINTED CIRCUIT BOARD WITH A HIGH FREQUENCY COUPLING ISLAND

[75] Inventors: Ronald Schiltmans, Eindhoven, Netherlands; Evangelos Avramis, Bochum, Germany

[73] Assignee: U.S. Philips Corporation, New York, N.Y.

[21] Appl. No.: 08/935,593

[22] Filed: Sep. 23, 1997

[30] Foreign Application Priority Data

Sep. 25, 1996 [DE] Germany ............... 196 39 369

[51] Int. Cl.$^6$ ................... H01L 23/66
[52] U.S. Cl. ............ 333/247; 361/780; 361/783; 361/820; 257/728
[58] Field of Search .................. 361/760, 777, 361/780, 783, 820; 257/728; 333/246, 247

[56] References Cited

U.S. PATENT DOCUMENTS

| | | | |
|---|---|---|---|
| 4,275,367 | 6/1981 | Gaglione et al. | 333/246 X |
| 4,613,834 | 9/1986 | Heine | 333/246 X |
| 4,812,895 | 3/1989 | Funck et al. | 257/728 X |

*Primary Examiner*—Robert Pascal
*Assistant Examiner*—Justin P. Bettendorf
*Attorney, Agent, or Firm*—F. Brice Faller

[57] ABSTRACT

A printed circuit board with a metal layer (15) arranged on its lower side and HF components (11, 12) arranged on its upper side, which components are connected by their input and/or output sides to HF sources, HF loads, or other HF components via microribbon lines (13, 14) and can be connected to a DC current source (21) via a separate connection line (20). To render possible a current-saving series arrangement of at least two HF components (11, 12),

- the metal layer (15) is electrically separated from the surrounding metal layer (15) by a gap (16) in the connection region of at least one HF component (11), and
- the metal island (17) thus formed in the region below the microribbon connection line (13) associated with the HF component (11) has an HF coupling to the adjoining metal layer (15).

7 Claims, 2 Drawing Sheets

PRINTED CIRCUIT BOARD WITH A HIGH FREQUENCY COUPLING ISLAND

BACKGROUND OF THE INVENTION

The invention relates to a printed circuit board with a meta layer arranged on its lower side and (high frequency HF) components arranged on its upper side, which components are connected by their input and/or output sides to HF sources, HF loads, or other HF components via microribbon lines and can be connected to a DC current source via a separate connection line.

Known printed circuit boards of this kind have an insulating support plate (substrate) on whose upper side a first electrode is arranged for forming said microribbon lines ("Integrierte Mikrowellenschaltungen" by Reinmut K. Hoffmann, Springer Verlag 1983, pp. 142–144). A second electrode for forming the microribbon lines is constructed as a metallization over the entire surface area of the lower side of the support plate. This metal layer also serves to drain off the DC current. The high-frequency (HF) components arranged on the upper side of the printed circuit board and connected to the microribbon lines are partly connected to the metal layer on the lower side by means of direct connections through the insulating plate. The HF signals are conducted to the gates of the HF components via the microribbon lines. To achieve a low-loss, low-reflection transmission of the HF energy, the metal layer is not interrupted at the lower side of the microribbon lines and has at least a width which is approximately the same as up to three times the width of the connection line on the upper side. For the same reason, a connection between the HF ground connection points of the HF components and the metal layer on the lower side is required to be direct and as short as possible. The currents passed by the HF components have a frequency at the input side of, for example, approximately 10 GHz to 13 GHz, and at the output side a frequency of, for example, 1 GHz to 3 GHz in the case in which the HF component is a frequency converter.

The individual HF components are provided with a DC current by a DC voltage source independently of the high-frequency currents, which DC current enters the current supply inputs of the HF components and is drained off into the metal ground layer at the lower side of the printed circuit board via direct connection lines of the HF components through the insulating plate. A DC voltage source of, for example, 6 V serves to supply the current in known constructions, where, for example, two HF components, for example ICs, are connected in parallel as far as the DC currents are concerned, so that each component receives a DC voltage of 6 V and, for example, a current of 100 mA flows through each component. This means that the common supply line for the two HF components passes a current of 200 mA. Such a current value, however, is too high for several applications. A solution could be that a voltage source of, for example, 12 V is chosen and that the two HF components are connected in series for the DC current, so that each HF component receives a voltage of 6 V. If such a construction were to be realized on a microribbon printed circuit board as described above, difficulties would arise on account of the metal layer at the lower side of the printed circuit board which is common to all components and essential for microribbon connection lines.

SUMMARY OF THE INVENTION

The invention has for its object to construct the printed circuit board such that a current-saving series arrangement of at least two HF components is rendered possible.

According to the invention, the metal layer is electrically separated from the surrounding metal layer by a gap in the connection region of at least one HF component, and the metal island thus formed in the region below the microribbon connection line associated with the HF component has an HF coupling to the adjoining metal layer.

It is achieved in this manner that the surface situated below the relevant HF component is electrically fully separated from the surrounding metal layer through the formation of a metal island such that the function of the microribbon line in the desired frequency range is not interfered with. Accordingly, there is no direct current connection any more between the metal island surface and the surrounding metal layer on the lower side of the support plate. It is ensured, however, by means of the HF coupling that the HF signal to be transmitted can pass this coupling junction or interface substantially unhampered. The invention thus renders possible a potential separation of HF components or HF circuit groups on such a printed circuit board in the DC range. Such a construction renders possible a series circuit of at least two HF components for the direct current, of which one component is arranged on the printed circuit board above the metal island surface and the other component above the adjoining metal layer, both being connected to its respective metal layer via a direct connection. Instead of an HF component, an HF circuit or an HF assembly comprising discrete components may alternatively be provided.

In an embodiment of the invention, the HF coupling is formed by at least two projections which lie immediately next to one another and which extend in the direction of the associated microribbon lines one projection being formed by the metal island and the other one by the adjoining metal layer. In a further embodiment of the invention, the ratio of the length of each projection to its width is much greater than 1.

Depending on the application, a further embodiment of the invention is characterized in that the number of projections and their length, width, and interspacings are dependent on the frequency and the bandwidth of the HF signals provided through the microribbon lines.

An advantageous construction which is readily implemented is characterized by respective comb-shaped projections of the metal island on the one hand and of the adjoining metal layer on the other hand which grip into one another in a meander-type arrangement. The number, width, and length of such projections depends on the frequency and bandwidth of the relevant HF signals to be conducted, as was noted above.

A preferred embodiment of the invention is characterized by a first HF component which lies above the metal island and by a second HF component which is connected in series with the first for direct current and which lies above the adjoining metal layer, both HF components being connected to a common DC voltage source such that the output of the voltage source is connected to the current supply input of the first HF component, the current supply output of the first HF component is connected to the metal island, the metal island is connected to the current supply input of the second HF component, and the current supply output of the second HF component is connected to the metal layer which is at ground potential.

An electrically decoupled signal transmission via microribbon lines is achieved thereby. The two HF components are connected in series for direct currents, while it is ensured that the necessary voltage drop can be realized across each component.

DETAILED DESCRIPTION OF THE PREFERRED EMBODIMENT

Figure 1:
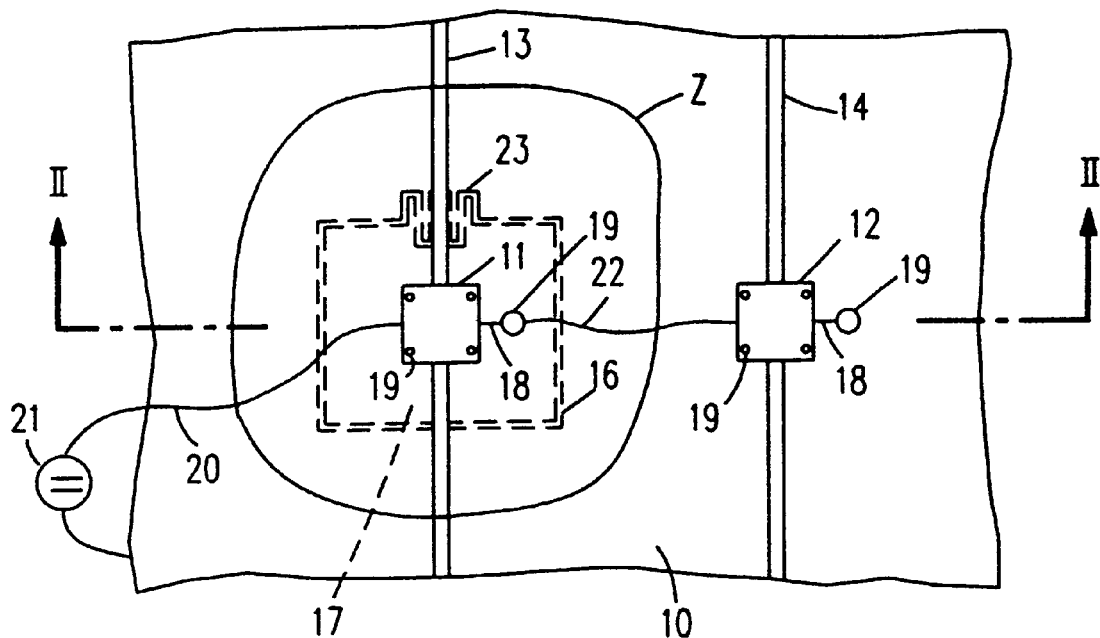
FIG. 1 is a diagram showing the upper side of a printed circuit board with two ICs provided thereon.
Figure 2:
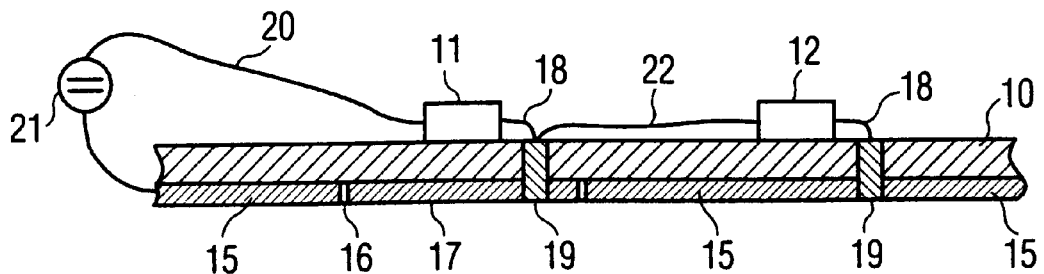
FIG. 2 is a cross-section taken on the line II—II in FIG. 1.

The printed circuit board shown in part in FIGS. 1 and 2 comprises an insulating substrate 10 with two ICs 11 and 12 (first and second HF components) arranged on its upper side and connected by their inputs to microribbon lines 13 and 14. The printed circuit board has a metal layer 15 at the lower side of the insulating substrate 10, which layer forms a metal island 17 defined by a continuous gap 16 in the region of the IC 11, electrically separated from the metal layer 15. The ICs 11 and 12 are connected to the island 17 and to the metal layer 15, respectively, situated below the ICs via direct connections 18 and through-metallizations 19. The current supply input of the first IC 11 is connected to a DC voltage source 21 via a DC supply line 20, and the current supply output of this IC 11 is connected to the metal island 17 via the connection 18 and through contact 19. The metal island 17 is connected to the current supply input of the second IC 12 via a further current supply line 22, and the current supply output of this second IC is connected to the metal layer 15 via the direct connection 18 and through-metallization 19, the metal layer being connected to the other pole of the DC voltage source 21.

The high-frequency signals for the ICs 11 and 12 are supplied via the microribbon lines 13 and 14. These signals have a frequency and a bandwidth. The low-loss and low-reflection transmission of the high-frequency signal via the microribbon line 13 in that region on the lower side of the support plate 10 where the metal layer 15 is interrupted is nevertheless safeguarded by a coupling junction 23 between the metal layer 15 and the metal island 17 in the region below the microribbon line 13.

Figure 4:
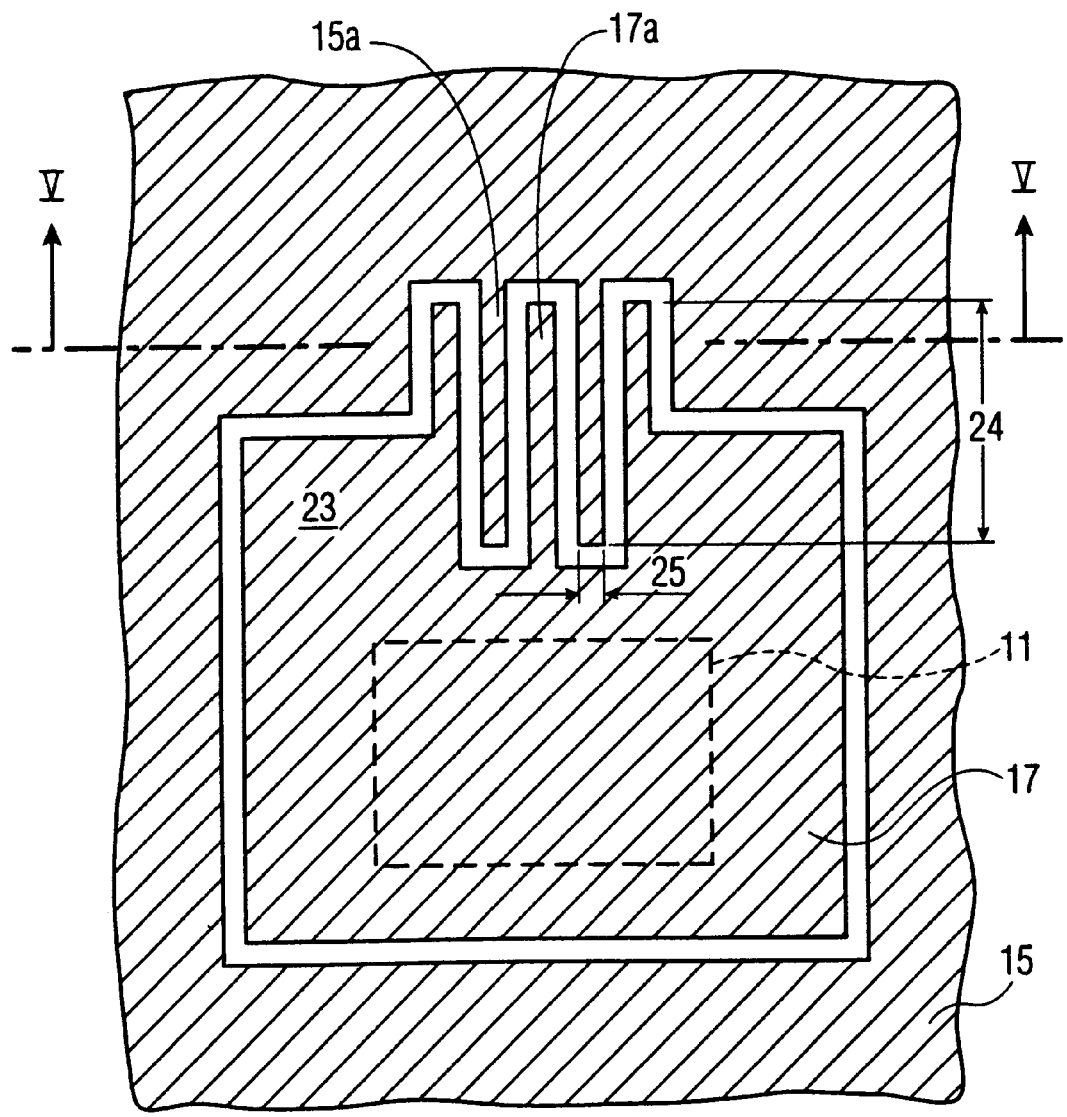
FIG. 4 is an enlarged view Z in FIG. 1, showing the metal lower side of the printed circuit board only.

The coupling junction 23 as shown on an enlarged scale in FIG. 4 comprises projections 17a of the metal island 17 extending in the direction of the microribbon line 13 and projections 15a of the metal layer 15 extending in the opposite direction, which projections 17a and 15a interdigitate.

Figure 5:
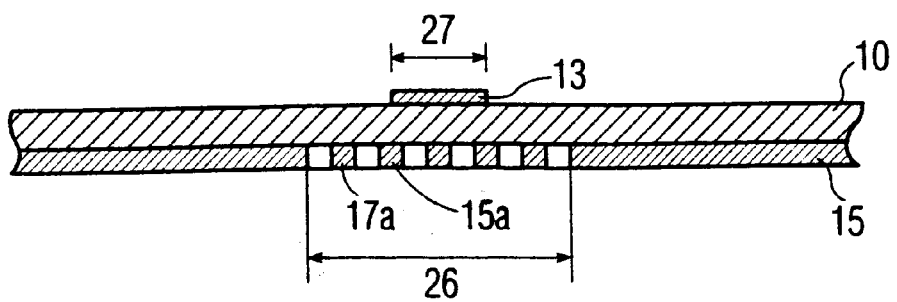
FIG. 5 is a cross-section taken on the line V—V in FIG. 4 through the entire printed circuit board.

FIG. 5 shows a cross-section taken on the line V—V in FIG. 4. FIGS. 4 and 5 are not shown true to scale, their individual parts are shown on a more or less enlarged scale. Furthermore, the lengths of the projections 17a and 15a are very much greater than their widths. The width of the coupling junction 23 is referenced 26, and the width of the microribbon line 13 is referenced 27. The number of projections 17a, 15a, their length 24, width 25, and interstitial space are dependent on the frequency and the bandwidth of the HF signals provided through the microribbon line 13.

Figure 3:
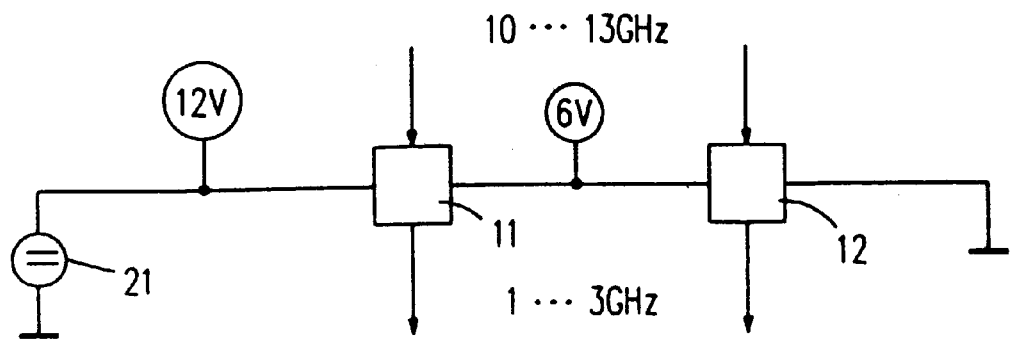
FIG. 3 is a circuit diagram corresponding to FIGS. 1 and 2.

The circuit diagram of FIG. 3 shows the two ICs 11 and 12 connected in series, across each of which a voltage of 6 V applied, the DC voltage source 21 supplying a voltage of 12 V. In this example, the HF imput signal has a frequency of 10 to 13 GHz, and the HF output signal a frequency of 1 to 3 GHz.

We claim:

1. A printed circuit board comprising
   a substrate having an upper side and a lower side,
   a first HF component on the upper side, said component having a signal input, a signal output, and a current input for connecting to a DC-voltage source,
   a microribbon line connected to one of said signal input and said signal output, and
   a metal layer on said lower side, said metal layer comprising a metal island opposite the first HF component, and a surrounding metal layer separated from the metal island by a gap, said metal island and said surrounding metal layer each having at least one projection lying immediately next to one another and parallel to the microribbon line, said microribbon line lying opposite said projections, said projections serving as an HF coupling for the microribbon line and the surrounding metal layer.

2. A printed circuit board as in claim 1 wherein each of said projections has a length and a width, said length being much greater than said width.

3. A printed circuit board as in claim 1 wherein said microribbon line carries HF signals having a frequency and a bandwidth, said projections having a length, a width, and an interstitial spacing which are dependent on the frequency and the bandwidth.

4. A printed circuit board as in claim 1 wherein the metal island and the surrounding metal layer each have a respective plurality of said projections which interdigitate in a serpentine arrangement.

5. A printed circuit board as in claim 1 further comprising a second HF component on the upper side opposite said surrounding metal layer, said second HF component being connected to said first HF component in series for direct current.

6. A printed circuit board as in claim 5 wherein
   said first HF component further comprises a current output which is electrically connected to said metal island, and
   said second HF component has a current input which is electrically connected to said metal island and a current output which is electrically connected to said surrounding metal layer, said surrounding metal layer being at ground potential.

7. A printed circuit board comprising
   a substrate having an upper side and a lower side,
   a first HF-component on the upper side, said component having a signal input, a signal output, a current input for connecting to a DC voltage source, and a current output,
   a microribbon line connected to one of said signal input and said signal output of said first HF-component,
   a metal layer on said lower side, said metal layer comprising a metal island opposite the first HF-component, and a surrounding metal layer separated from the metal island by a gap, said metal island being electrically connected to said current output of said first HF-component,
   an HF coupling for the microribbon line and the surrounding metal layer, and a second HF-component on the upper side opposite said surrounding metal layer, said second HF-component having a current input which is electrically connected to said metal island and a current output which is electrically connected to said surrounding metal layer, said surrounding metal layer being at ground potential, said first and second HF components being connected in series between said DC voltage and ground potential.

* * * * *